United States Patent [19]

Kitora et al.

[11] Patent Number: 4,814,645

[45] Date of Patent: Mar. 21, 1989

[54] TTL CIRCUIT HAVING IMPROVED PULLDOWN CIRCUIT

[75] Inventors: Takatsugu Kitora; Youichirou Taki, both of Itami, Japan

[73] Assignee: Mitsubishi Denki Kabushiki Kaisha, Tokyo, Japan

[21] Appl. No.: 96,471

[22] Filed: Sep. 15, 1987

[30] Foreign Application Priority Data

Sep. 22, 1986 [JP] Japan .................................. 61-224328

[51] Int. Cl.⁴ ........................ H03K 19/8; H03K 19/13; H03K 19/20; H03K 3/13
[52] U.S. Cl. .................................... 307/456; 307/458; 307/551; 307/566
[58] Field of Search ............... 307/454, 456, 458, 254, 307/299.1, 443, 551, 559, 561, 566, 300

[56] References Cited

U.S. PATENT DOCUMENTS

| | | | |
|---|---|---|---|
| 3,999,080 | 12/1976 | Weathersby, Jr. et al. | 307/456 |
| 4,228,371 | 10/1980 | Mazgy | 307/300 X |
| 4,400,635 | 8/1983 | Mazgy | 307/458 X |
| 4,501,976 | 2/1985 | West et al. | 307/458 X |
| 4,542,331 | 9/1985 | Boyer | 307/458 X |
| 4,697,103 | 9/1987 | Ferris et al. | 307/456 |
| 4,728,824 | 3/1988 | Van Zantel | 307/458 X |

OTHER PUBLICATIONS

Mitsubishi Semiconductors Data Book 1985, Bipolar Digital IC Alsttl.

Primary Examiner—Stanley D. Miller
Assistant Examiner—David R. Bertelson
Attorney, Agent, or Firm—Oblon, Fisher, Spivak, McClelland & Maier

[57] ABSTRACT

An SBD-npn transistor is connected between an output terminal and a low potential source connection terminal and pulldown means such as a resistor and a Schottky barrier diode are inserted in series between the base of the SBD-npn transistor and the low potential source connection terminal. The pulldown means extracts leakage current appearing between the base and the collector of the SBD-npn transistor being in a nonconducting state, to prevent the leakage current from serving as base current.

4 Claims, 2 Drawing Sheets

TTL CIRCUIT HAVING IMPROVED PULLDOWN CIRCUIT

BACKGROUND OF THE INVENTION

1. Field of the Invention

The present invention relates to a logic circuit, and more particularly, it relates to an output circuit of ALSTTL (advance low power Schottky transistor-transistor logic), for example.

2. Description of the Prior Art

A well-known ALSTTL output circuit is described in DATA BOOK "MITSUBISHI SEMICONDUCTORS 1985 BIPOLAR DIGITAL IC ALSTTL", p. 2-3, for example.

FIG. 1 shows an output equivalent circuit described in this literature, which circuit has a terminal 1 for connection to a high potential source, a terminal 2 for connection to a low potential source and an output terminal 3. Signals for designating low and high levels of the output terminal 3 are supplied to the base of an npn transistor 4 having a Schottky barrier diode. Such transistors as transistor 4 are hereinafter referred to SBD-npn transistor. An SBD-npn transistor 5 conducts in response to conduction of the SBD-npn transistor 4 to selectively connect the output terminal 3 to the low potential side. The SBD-npn transistor 5 has a collector connected to the output terminal 3, an emitter connected to the low potential source connection terminal 2 and a base connected to the emitter of the SBD-npn transistor 4. An SBD-npn transistor 6 is adapted to extract carriers from the base of the SBD-npn transistor 5 when the same is switched from a conducting state to a nonconducting state. The SBD-npn transistor 6 has a collector and a base connected to the node between the emitter of the SBD-npn transistor 4 and the base of the SBD-npn transistor 5 through resistors 7 and 8, respectively, and an emitter connected to the low potential source connection terminal 2. The SBD-npn transistor 6 is smaller in emitter area than the SBD-npn transistor 5 such that the former is about 1/5 of the latter in emitter area, for example, and the base-to-emitter voltage of the SBD-npn transistor 6 is so increased that the SBD-npn transistor 6 transiently conducts only when the SBD-npn transistor 5 switches from a conducting state to a nonconducting state.

An SBD-npn transistor 9 is in Darlington connection with an npn transistor 10 to be equivalent to a transistor element which conducts in response to nonconduction of the SBD-npn transistor 4 to selectively connect the output terminal 3 to the high potential side. The emitter of the npn transistor 10 is connected to the output terminal 3 and the collectors of the SBD-npn transistor 9 and the npn transistor 10 are connected with each other to be connected to the high potential source connection terminal 1 through a resistor 11 while the emitter of the SBD-npn transistor 9 is connected with the base of the npn transistor 10. The base of the SBD-npn transistor 9 is connected to the collector of the SBD-npn transistor 4, and the node therebetween is connected to the high potential source connection terminal 1 through a resistor 12.

Description is now made on the operation of the circuit in the aforementioned structure. When a high-level signal is inputted in the base of the SBD-npn transistor 4, the SBD-npn transistors 4 and 5 conduct to absorb current from the output terminal 3 into the low potential side, whereby the potential of the output terminal 3 goes low. Since the collector potential of the SBD-npn transistor 4 is lowered at this time, the SBD-npn transistor 9 and the npn transistor 10 being in Darlington connection are in nonconducting states.

Then a low-level signal is inputted in the base of the SBD-npn transistor 4 so that the same enters a nonconducting state and the collector potential thereof is increased, whereby the SBD-npn transistor 9 and the npn transistor 10 enter conducting states. Thus, the high potential source connection terminal 1 supplies current to the output terminal 3 through the resistor 11. However, since the SBD-npn transistor 5 is not yet in a nonconducting state, the supplied current flows as collector current for the SBD-npn transistor 5, whereby the base potential of the SBD-npn transistor 5 is increased so that the SBD-npn transistor 6 transiently enters a conducting state. Thus the base carriers of the SBD-npn tansistor 5 is extracted so that the SBD-npn transistor 5 enters a nonconducting state, and the potential of the output terminal 3 goes high.

The SBD-npn transistor 4 conducts when the voltage level of a signal applied to its base is higher than the sum of base-to-emitter voltage $V_{BE5}$ of the SBD-npn transistor 5 and base-to-emitter voltage $V_{BE4}$ of the SBD-npn transistor 4 on the basis of the potential of the low potential source connection terminal 2, while entering a nonconducting state when the former is lower than the latter.

The logic circuit of FIG. 1 employs the transistors having Schottky barrier diodes for high-speed operation and low power consumption. However, when the SBD-npn trnasistor 5 is in a nonconducting state and the output terminal 3 is at a high level, leakage current of the Schottky barrier diode between the base and the collector of the SBD-npn transistor 5 partially serves as the base current of the SBD-npn transistor 5, whereby collector current increased by current amplification flows from the output terminal 3 to be leaked.

FIG. 2 shows the structure of an SBD-npn transistor having a guard ring for reducing the leakage current of a Schottky barrier diode. This SBD-npn transistor has a collector region 21 formed by an n+-type silicon layer 21a and an n-type silicon layer 21b, a base region formed by p+-type silicon layers 22 and an emitter region formed by an n+-type silicon layer 23. The collector region 21 are connected to a collector interconnection layer 24 of aluminum through an n+-type region 25 and the emitter region 23 is connected to an emitter interconnection layer 26 of aluminum while the base regions 22 are connected to a base interconnection layer 27 of aluminum. The base regions 22 are in ohmic contact with the base interconnection layer 27 and the collector region 21 is in Schottky junction with the base interconnection layer 27. The base regions 22 encircle the peripheral portion of the Schottky junction, thereby to define a guard ring. Numeral 28 indicates insulation oxide films and numeral 29 indicates inter-layer isolation oxide films.

The leakage current of the Schottky barrier diode is reduced through employment of the SBD-npn transistor having a guard rign as shown in FIG. 2 as the SBD-npn transistor 5, whereas base-collector junction capacitance is increased by increase in base-collector junction area such that the base potential of the SBD-npn transistor 5 is raised by the capacitance when the output terminal 3 is turned from a low level to a high level and output voltage waveform changing from a low level $V_{OL}$ to a high level $V_{OH}$ is distorted as shown at C in FIG. 3. Referring to FIG. 3, symbol A denotes an input signal waveform and symbol B denotes an output waveform in employment of an SBD-npn transistor having no guard ring.

SUMMARY OF THE INVENTION

The present invention is directed to a logic circuit which makes low or high logic output by selectively connecting an output terminal to either a low potential point or a high potential point.

The logic circuit according to the present invention comprises a first transistor which receives signals designating low and high levels of the output terminal in its base for conducting in response to designation of a low level while entering a nonconducting state in response to designation of a high level, a second transistor connected between the low potential point and the output terminal to enter a conducting state in response to nonconduction of the first transistor while entering a nonconducting state in response to conduction of the first trasnistor, a third transistor connected between the low potential point and the output terminal to enter a conducting state in response to conduction of the first transistor while entering a nonconducting state in response to nonconduction of the first transistor and pulldown means connected between a base of the third transistor and the low potential point to pull down the base potential of the third transistor when the third transistor is in a nonconducting state.

Accordingly, it is an object of the present invention to provide a logic circuit which can prevent current leakage from the output terminal through the third transistor when the third transistor is in a nonconducting state and the output terminal is at a high level, thereby to prevent distortion of an output waveform changing from a low level to a high level.

These and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
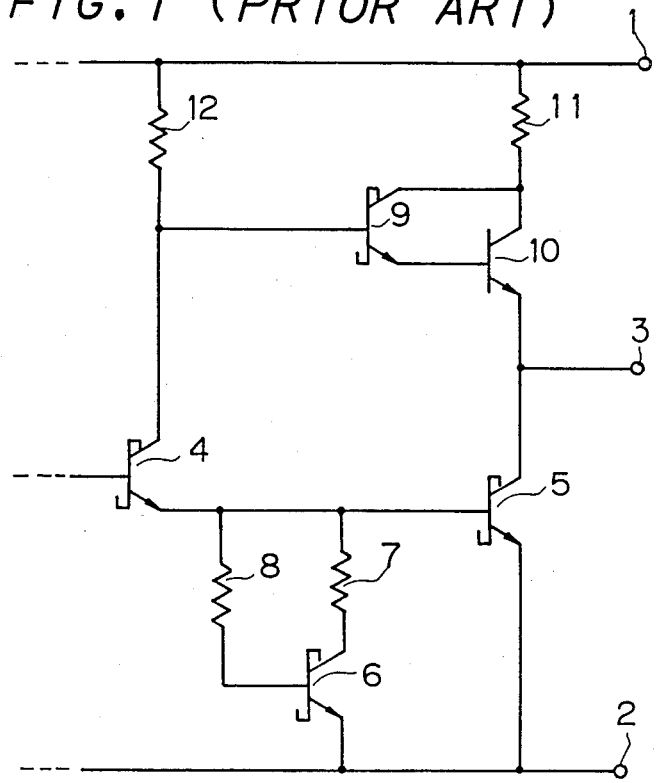
FIG. 1 is a circuit diagram showing a conventional logic circuit.
Figure 2:
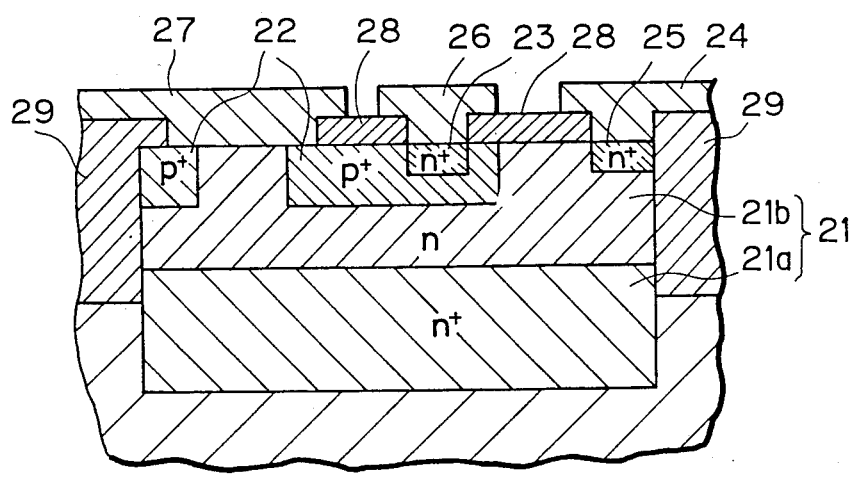
FIG. 2 is a cross sectional view showing the structure of an SBD-npn transistor having a guard ring.
Figure 3:
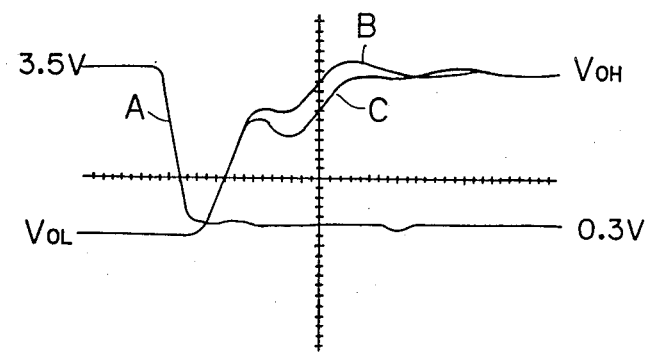
FIG. 3 illustrates output voltage waveforms changing from low levels to high levels.
Figure 4:
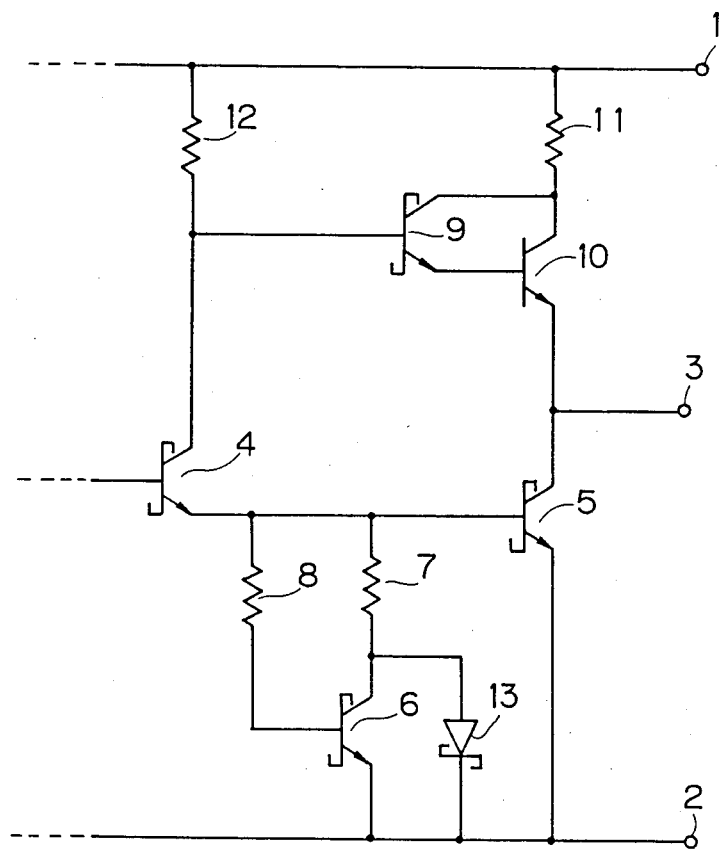
FIG. 4 is a circuit diagram showing a logic circuit according to an embodiment of the present invention.

FIG. 4 is a circuit diagram showing a logic circuit according to an embodiment of the present invention, which circuit is formed by connecting a Schottky barrier diode between the collector and the emitter of the SBD-npn transistor 6 of the output equivalent circuit shown in FIG. 1. Namely, in FIG. 4, the anode of a Schottky barrier diode 13 is connected to the collector of a SBD-npn transistor 6, and the cathode thereof is connected to the emitter of the SBD-npn transistor 6 and therefore to a low potential source connection terminal 2. Other structure of this embodiment is similar to that shown in FIG. 2.

Description is now made on the operation of the circuit in the aforementioned structure. An SBD-npn transistor 4 conducts when a high-level signal is inputted in its base. Then the base potential of an SBD-npn transistor 5 is raised to exceed the threshold level thereof, whereby the SBD-npn transistor 5 conducts to absorb current from an output terminal 3 into the low potential side, so that the potential of the output terminal 3 goes low.

The collector potential of the SBD-npn transistor 4 goes lower than the threshold level of an SBD-npn transistor 9, and hence the SBD-npn transistor 9 and an npn transistor 10, which are in Darlington connection to be equivalent to one transistor element, are in nonconducting states. While current flows from the base of the SBD-npn transistor 5 to the low potential source connection terminal 2 through a resistor 7 and the Schottky barrier diode 13, the current value can be reduced by selecting the resistance value of the resistor 7 at a relatively high level of about 10 K$\Omega$, for example, so that no disadvantageous influence is exerted on the operation of the circuit.

Then, a low-level signal is inputted in the base of the SBD-npn transistor 4, so that the SBD-npn transistor 4 enters a nonconducting state. Then the collector potential of the SBD-npn transistor 4 is raised, so that the SBD-npn transistor 9 and the npn transistor 10 being in Darlington connection enter conducting states. Thus, current is supplied from a high potential source connection terminal 1 to the output terminal 3 through a resistor 11, while the supplied current flows as collector current for the SBD-npn transistor 5 since the same is not yet in a nonconducting state at this time, whereby the base potential of the SBD-npn transistor 5 is raised so that the SBD-npn transistor 6 transiently conducts. Thus, the carriers in the base of the SBD-npn transistor 5 is extracted so that the SBD-npn transistor 5 enters a nonconducting state, whereby the potential of the ouput terminal 3 goes high.

When a Schottky barrier diode betweent the base and the collector of the SBD-npn transistor 5 has leakage current in this state, the leakage current is extracted by the Schottky barrier diode 13 through a resistor 7. Thus, the leakage current will not serve as the base current of the SBD-npn transistor 5, whereby no current is leaked from the output terminal 3 through the SBD-npn transistor 5. As the result, no guard ring is required in order to reduce the leakage current of the Schottky barrier diode of the SBD-npn transistor 5, whereby increase in base-collector junction capacitance of the SBD-npn transistor 5 can be prevented thereby to prevent distorsion in output waveform changing from a low level to a high level.

Even if a guard ring is provided and the base-collector junction capacitance of the SBD-npn transistor 5 is increased, the charge stored by the junction capacitance can be extracted by the Schottky barrier diode 13 to prevent the base potential from being raised by the junction capacitance, whereby the output waveform can be prevented from distortion similarly to the above.

When the SBD-npn transistor 5 is in a nonconducting state, the base potential of the SBD-npn transistor 5 is pulled down by the resistor 7 and the Schottky barrier diode 13 in the aforementioned embodiment. A similar effect can be obtained by replacing the Schottky barrier diode 13 by a resistor, i.e., by directly connecting the base of the SBD-npn transistor 5 to the low potential source connection terminal 2 through a resistor of a relatively high resistance value. In this case, however, through current flows in the resistor when the output terminal 3 is switched from a high level to a low level, i.e., when the SBD-npn transistors 4 and 5 are switched from nonconducting states to conducting states, whereby the edge of the ouput waveform is rounded. Thus, it is more preferable to employ the Schottky barrier diode 13.

Although SBD-npn transistors and Schottky barrier diodes are employed in the circuit of the aforementioned embodiment, other types of transistors and diodes can be employed by appropriately modifying the circuit. Further, the SBD-npn transistor 9 and the npn transistor 10 in Darlington connection are equivalent to one transistor element in function.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A logic circuit for making low or high logic output by selectively connecting an output terminal to either a low potential point or a high potential point, said logic circuit comprising:
    a first transistor receiving signals designating low and high levels in its base for conducting in response to designation of a low level while entering a nonconducting state in response to designation of a high level;
    a second transistor connected between said high potential point and said output terminal for conducting in response to nonconduction of said first transistor while entering a nonconducting state in response to conduction of said first transistor;
    a third transistor connected between said low potential point and said output terminal for conducting in response to conduction of said first transistor while entering a nonconducting state in response to nonconduction of said first transistor; and
    pulldown means connected between a base of said third transistor and said low potential point for pulling down the base potential of said third transistor when said third transistor is in a nonconducting state said pulldown means comprises a diode inserted between the base of said third transistor and said low potential point so that the anode thereof is coupled to the base of said third transistor and the cathode thereof is coupled to said low potential point and further with a resistor being connected in series with said diode, and still further with a fourth transistor having a collector connected to the base of said third transistor through a resistor, an emitter connected to said low potential point and a base coupled to the base of said third transistor, said fourth transistor being formed to be smaller in emitter area than said third transistor.

2. A logic circuit in accordance with claim 1, wherein said first transistor has a collector connected to a base of said second transistor and coupled to said high potential point and an emitter connected to the base of said third transistor,
    said second transistor has a collector coupled to said high potential point and an emitter connected to said output terminal, and
    said third transistor has a collector connected to said output terminal and an emitter connected to said low potential point.

3. A logic circuit in accordance with claim 1, wherein said diode is a Schottky barrier diode, and said resistor has a relatively high resistance value.

4. A logic circuit in accordance with claim 1, wherein said third transistor is a transistor provided with a Schottky barrier diode having no guard ring.

* * * * *